(12) United States Patent
Arumugam et al.

(10) Patent No.: US 11,119,138 B1
(45) Date of Patent: *Sep. 14, 2021

(54) CAPACITIVE SENSOR INCLUDING COMPENSATION FOR PHASE SHIFT

(71) Applicant: Cirrus Logic International Semiconductor Ltd., Edinburgh (GB)

(72) Inventors: Vikrant Arumugam, Cedar Park, TX (US); Amar Vellanki, Cedar Park, TX (US); Vamsikrishna Parupalli, Austin, TX (US); Zhong You, Austin, TX (US); Johann G. Gaboriau, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/838,405

(22) Filed: Apr. 2, 2020

Related U.S. Application Data

(63) Continuation of application No. 15/943,154, filed on Apr. 2, 2018, now Pat. No. 10,649,015.

(60) Provisional application No. 62/548,269, filed on Aug. 21, 2017.

(51) Int. Cl.
*G01R 27/26* (2006.01)

(52) U.S. Cl.
CPC .................. *G01R 27/2605* (2013.01)

(58) Field of Classification Search
CPC ............ G01R 27/2605; G01R 31/2887; G01R 31/2812; G01R 31/2831; G01R 31/312; G01R 31/08; G01R 31/2805; G01R 31/06794; G01D 5/24; G01D 5/2417
See application file for complete search history.

(56) References Cited

U.S. PATENT DOCUMENTS

| | | | | |
|---|---|---|---|---|
| 7,290,435 | B2 * | 11/2007 | Seeger | G01C 19/5719 73/1.37 |
| 9,644,963 | B2 | 5/2017 | Lee et al. | |
| 9,897,641 | B2 * | 2/2018 | Neel | G01R 31/016 |
| 10,060,757 | B2 * | 8/2018 | Opris | G01C 19/5776 |
| 2011/0084709 | A1 * | 4/2011 | Asjes | G01R 27/2605 324/658 |
| 2013/0268228 | A1 | 10/2013 | Opris et al. | |
| 2014/0132186 | A1 | 5/2014 | Tazartes | |

(Continued)

OTHER PUBLICATIONS

O'Dowd et al., "Capacitive sensor interfacing using sigma-delta techniques", IEEE Sensors, 2005, Irvine, CA, 2005, pp. 951-954.

*Primary Examiner* — Thang X Le
(74) *Attorney, Agent, or Firm* — Jackson Walker L.L.P.

(57) ABSTRACT

A method may include applying an excitation signal to a capacitor of the capacitive sensor which causes generation of a modulated signal from an input signal indicative of a variance in a capacitance of the capacitor, detecting the modulated signal with a detector to generate a detected modulated signal that has a phase shift relative to the excitation signal, demodulating the detected modulated signal into an in-phase component and a quadrature component using a reference signal, nullifying the quadrature component by setting a phase of the reference signal relative to the excitation signal to compensate for the phase shift, and outputting the in-phase component as an unmodulated output signal representative of the capacitance.

16 Claims, 3 Drawing Sheets

(56) References Cited

U.S. PATENT DOCUMENTS

| | | | |
|---|---|---|---|
| 2015/0276406 A1* | 10/2015 | Rastegar | G01C 19/5712 |
| | | | 73/504.12 |
| 2016/0094917 A1 | 3/2016 | Wilk et al. | |
| 2016/0327393 A1 | 11/2016 | Shaeffer et al. | |
| 2017/0167875 A1 | 6/2017 | Bhandari et al. | |
| 2017/0314971 A1* | 11/2017 | Lamesch | G01D 5/24 |

* cited by examiner

CAPACITIVE SENSOR INCLUDING COMPENSATION FOR PHASE SHIFT

RELATED APPLICATION

The present disclosure is a continuation of U.S. patent application Ser. No. 15/943,154, filed Apr. 2, 2018, which claims priority to U.S. Provisional Patent Application Ser. No. 62/548,269, filed Aug. 21, 2017, each of which is incorporated by reference herein in its entirety.

FIELD OF DISCLOSURE

The present disclosure relates in general to measuring capacitance, and more specifically, to systems and methods for measuring capacitance using a capacitance to voltage converter in a noisy environment.

BACKGROUND

In many electrical and electronic systems, it may be desirable to measure a capacitance within a circuit in order to take action responsive to the measured capacitance. For example, a capacitive sensor used in an audio speaker may be used to sense a position of a transducer diaphragm of the audio speaker. The capacitance value of a capacitive sensor which changes responsive to an audio signal driven through the speaker may be measured by driving a carrier tone on one terminal of the speaker and sensing a modulated signal current on the other terminal.

One type of apparatus for measuring capacitance is known as a capacitance-to-digital converter, or "CDC," which is capable of measuring a capacitance and generating a digital output signal indicative of a magnitude of the measured capacitance. A CDC-based capacitive sensor may operate in a noisy environment which can affect measurement sensitivity of a measurement, and thus, systems and methods for reducing or eliminating such noise may be desirable.

SUMMARY

In accordance with the teachings of the present disclosure, certain disadvantages and problems associated with performance of existing capacitance-to-digital converters have been reduced or eliminated.

In accordance with embodiments of the present disclosure, a method may include applying an excitation signal to a capacitor of the capacitive sensor which causes generation of a modulated signal from an input signal indicative of a variance in a capacitance of the capacitor, detecting the modulated signal with a detector to generate a detected modulated signal that has a phase shift relative to the excitation signal, demodulating the detected modulated signal into an in-phase component and a quadrature component using a reference signal, nullifying the quadrature component by setting a phase of the reference signal relative to the excitation signal to compensate for the phase shift, and outputting the in-phase component as an unmodulated output signal representative of the capacitance.

In accordance with these and other embodiments of the present disclosure, an apparatus for measuring a capacitive sensor output may include an excitation source configured to apply an excitation signal to a capacitor of the capacitive sensor which causes generation of a modulated signal from an input signal indicative of a variance in a capacitance of the capacitor, a detector configured to detect the modulated signal and generate a detected modulated signal that has a phase shift relative to the excitation signal, a demodulator configured to demodulate the detected modulated signal into an in-phase component and a quadrature component using a reference signal, a controller configured to nullify the quadrature component by setting a phase of the reference signal relative to the excitation signal to compensate for the phase shift, and an output configured to output the in-phase component as an unmodulated output signal representative of the capacitance.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein.

DETAILED DESCRIPTION

Figure 1:
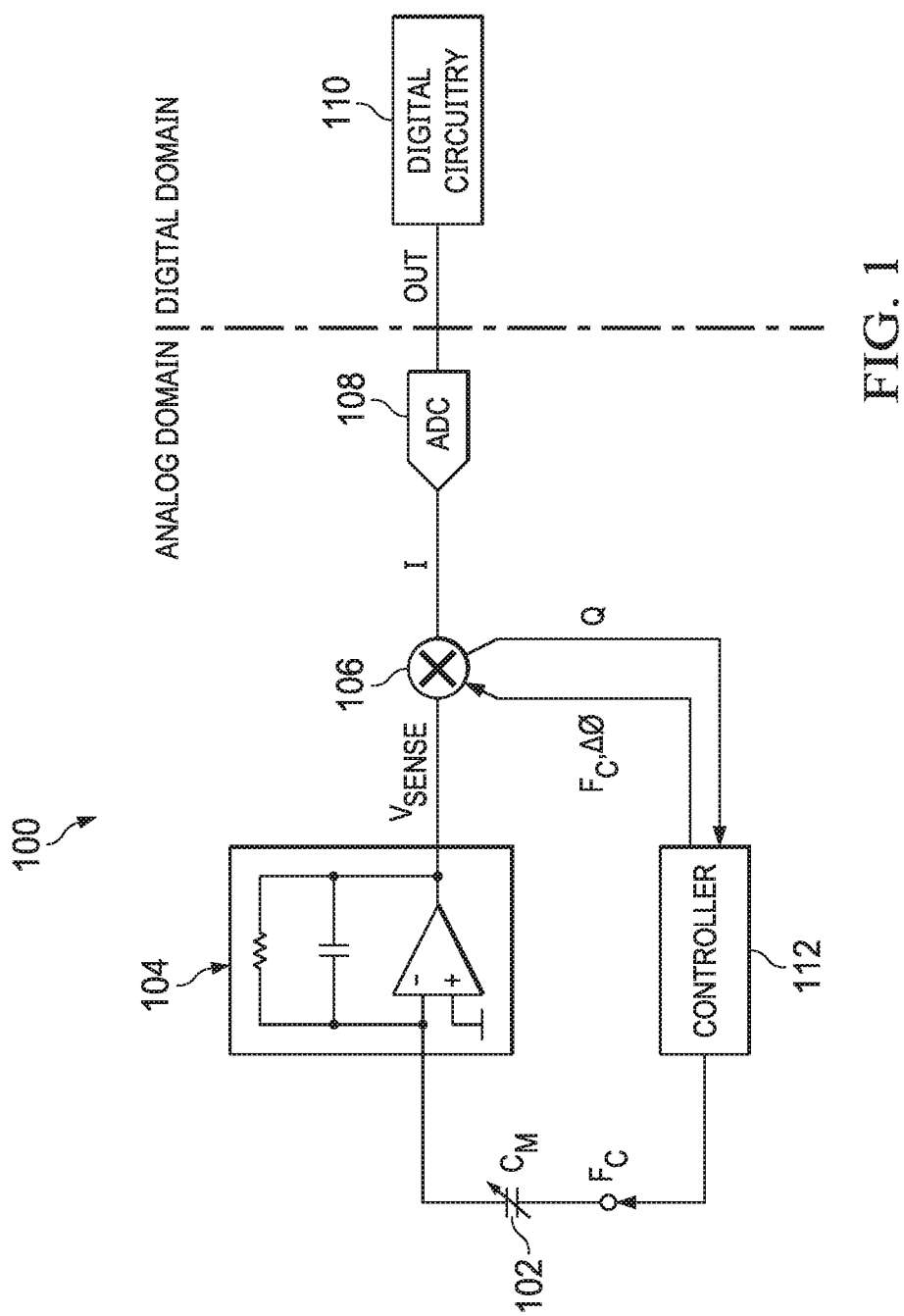
FIG. 1 is a block diagram of selected components of an example capacitance-sensing circuit wherein carrier demodulation is implemented in an analog domain, in accordance with embodiments of the present disclosure.

FIG. 1 is a block diagram of selected components of an example capacitance-sensing circuit 100 for sensing a variable capacitance $C_M$ of a component 102, wherein carrier demodulation is implemented in an analog domain, in accordance with embodiments of the present disclosure. In some embodiments, component 102 may comprise a transducer and capacitance $C_M$ may be representative of a displacement of such transducer. Examples of such a transducer may include an audio speaker, a linear resonant actuator, and a haptic transducer. However, the systems and methods disclosed herein are not limited to measuring displacement in a transducer, and may be applied to any suitable measuring or sensing of a capacitance.

As shown in FIG. 1, capacitance sensing circuit 100 may include a capacitance-to-voltage converter (CVC) 104, a demodulator 106, an analog-to-digital converter (ADC) 108, digital circuitry 110, and a controller 112. CVC 104 may comprise a charge integrator configured to integrate charge at its input to generate a voltage signal $V_{SENSE}$ indicative of capacitance $C_M$ of component 102. Such voltage signal $V_{SENSE}$ may be generated by applying an excitation signal at a carrier frequency $f_C$ to one of the terminals of capacitance $C_M$ of component 102, which may cause generation of a modulated voltage signal $V_{SENSE}$ from a baseband signal indicative of capacitance $C_M$. Thus, CVC 104 may in effect operate as a detector for detecting a modulated signal indicative of capacitance $C_M$ of component 102 and generating therefrom a detected modulated signal (e.g., voltage signal $V_{SENSE}$). However, CVC 104 may include components that introduce a phase shift between the input of CVC 104 and output of CVC 104, such that the detected modulated signal (e.g., voltage signal $V_{SENSE}$) has a phase shift relative to the excitation signal.

Demodulator 106 may demodulate modulated voltage signal $V_{SENSE}$ at the carrier frequency $f_C$ in an analog domain of capacitance sensing circuit 100 to generate an output signal representative of a capacitance of the capacitor wherein the demodulating is based, at least in part, on the excitation signal. In some embodiments, demodulator 106 may comprise a quadrature demodulator configured to demodulate modulated voltage signal $V_{SENSE}$ to generate an in-phase component I and a quadrature component Q. Also as described in greater detail below, such demodulation may be based on a reference signal that may compensate for the phase shift of the detected modulated signal relative to the excitation signal wherein a phase $\Delta\varphi$ of the reference signal is set relative to the excitation signal in order to nullify quadrature component Q of the demodulated signal. Accordingly, demodulator 106 may output in-phase component I as an unmodulated output signal representative of the capacitance of component 102. By setting phase $\Delta\varphi$ of the reference signal set relative to the excitation signal in order to nullify quadrature component Q of the demodulated signal, the in-phase component I may be maximized, resulting in optimization of dynamic range of the signal.

ADC 108 may convert the demodulated analog signal (e.g., in-phase component I) into an equivalent digital output signal OUT that may be further processed by digital circuitry 110. As shown in FIG. 1, ADC 108 may define a boundary between an analog domain of a signal path of capacitance sensing circuit 100 and a digital domain of the signal path of capacitance sensing circuit 100.

Controller 112 may be configured to apply the excitation signal to one of the terminals of capacitance $C_M$ of component 102 as described above. In some embodiments, such excitation signal may comprise a square-wave signal. Controller 112 may also be configured to generate the reference signal to demodulator 106 with phase shift $\Delta\varphi$ relative to the excitation signal such that demodulator 106 demodulates detected modulated voltage signal $V_{SENSE}$ as described above and compensates for the phase shift of the detected modulated voltage signal $V_{SENSE}$ relative to the excitation signal. For example, in some embodiments, the phase shift of the detected modulated voltage signal $V_{SENSE}$ relative to the excitation signal may be unknown, and thus, controller 112 may nullify quadrature component Q by varying phase shift $\Delta\varphi$ of the reference signal relative to the excitation signal until quadrature component Q is zero or approximately zero.

In some embodiments, controller 112 may set phase shift $\Delta\varphi$ of the reference signal relative to the excitation signal once during production or manufacturing of capacitance sensing circuit 100. In other embodiments, controller 112 may set phase shift $\Delta\varphi$ of the reference signal relative to the excitation signal once for each power cycle of capacitance sensing circuit 100. In yet other embodiments, controller 112 may set phase shift $\Delta\varphi$ of the reference signal relative to the excitation signal by continuously, during operation of capacitance sensing circuit 100, varying phase $\Delta\varphi$ of the reference signal relative to the excitation signal responsive in order to nullify the quadrature component.

Figure 2:
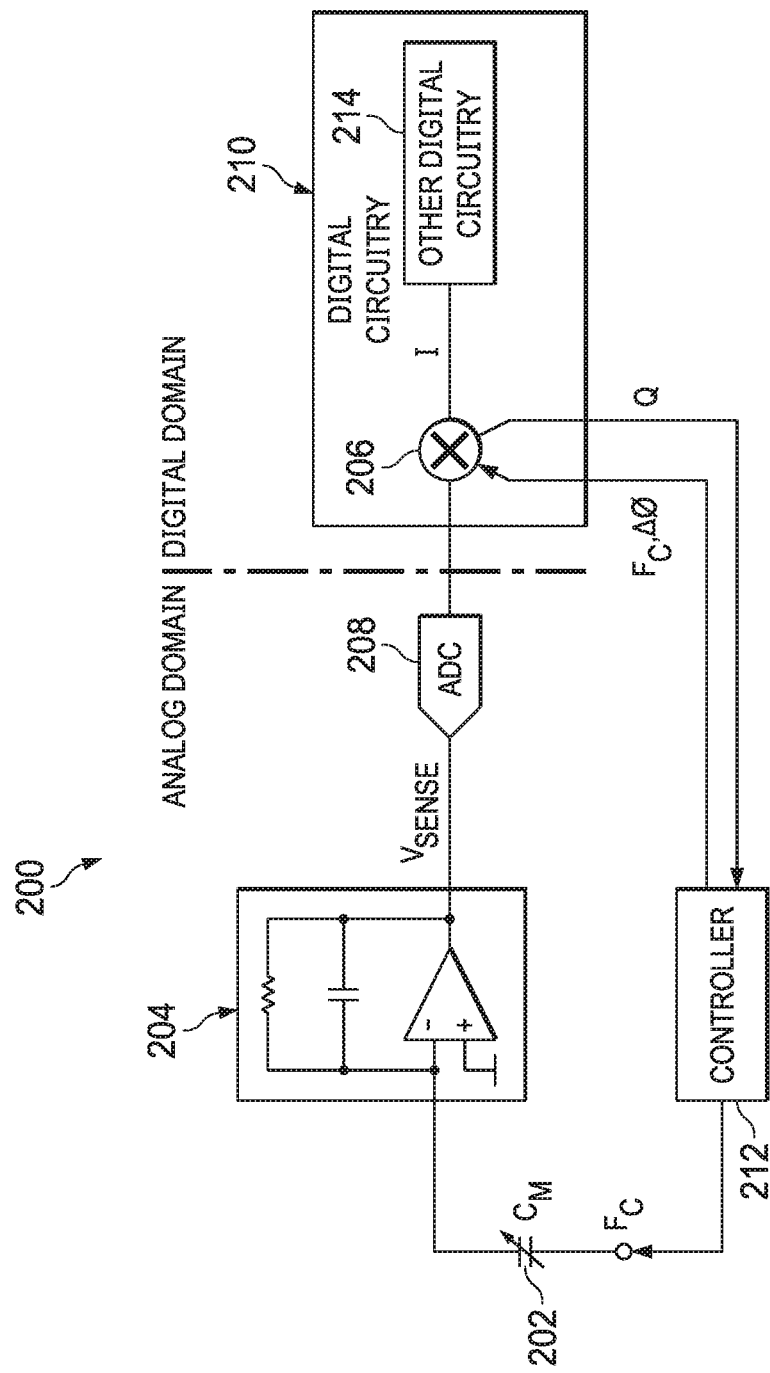
FIG. 2 is a block diagram of selected components of an example capacitance-sensing circuit wherein carrier demodulation is implemented in the digital domain, in accordance with embodiments of the present disclosure.

FIG. 2 is a block diagram of selected components of an example capacitance-sensing circuit 200 for sensing a variable capacitance $C_M$ of a component 202, wherein carrier demodulation is implemented in a digital domain, in accordance with embodiments of the present disclosure. In some embodiments, component 202 may comprise an audio speaker and capacitance $C_M$ may be representative of a displacement of an audio transducer of such audio speaker. However, the systems and methods disclosed herein are not limited to measuring displacement in an audio speaker, and may be applied to any suitable measuring or sensing of a capacitance.

As shown in FIG. 2, capacitance sensing circuit 200 may include a capacitance-to-voltage converter (CVC) 204, an analog-to-digital converter (ADC) 208, digital circuitry 210, and a controller 212. CVC 204 may comprise a charge integrator configured to integrate charge at its input to generate a voltage signal $V_{SENSE}$ indicative of capacitance $C_M$ of component 202. Such voltage signal $V_{SENSE}$ may be generated by applying an excitation signal at a carrier frequency $f_C$ to one of the terminals of capacitance $C_M$ of component 202, which may cause generation of a modulated voltage signal $V_{SENSE}$ from a baseband signal indicative of capacitance $C_M$.

ADC 208 may convert modulated voltage signal $V_{SENSE}$ into an equivalent modulated digital signal that may be further processed by digital circuitry 210. As shown in FIG. 2, ADC 208 may define a boundary between an analog domain of a signal path of capacitance sensing circuit 200 and a digital domain of the signal path of capacitance sensing circuit 200.

Thus, together CVC 204 and ADC 208 may in effect operate as a detector for detecting a modulated signal indicative of capacitance $C_M$ of component 202 and generating therefrom a detected modulated signal (e.g., at the output of ADC 208). However, CVC 204 and/or ADC 208 may include components that introduce a phase shift between the input of CVC 204 and output of ADC 208, such that the detected modulated signal (e.g., at the output of ADC 208) has a phase shift relative to the excitation signal.

As also depicted in FIG. 2, digital circuitry 210 may include a demodulator 206. Demodulator 206 may demodulate the modulated digital signal from ADC 208 at the carrier frequency $f_C$ in a digital domain of capacitance sensing circuit 200 to generate a digital output signal I (that may be further processed by other digital circuitry 214) representative of a capacitance of the capacitor wherein the demodulating is based, at least in part, on the excitation signal. For example, the demodulation signal received by demodulator 206 may comprise a sine wave at carrier frequency $f_C$. In some embodiments, demodulator 206 may comprise a quadrature demodulator configured to demodulate the detected modulated signal in order to generate an in-phase component I and a quadrature component Q. Also as described in greater detail below, such demodulation may be based on a reference signal that may compensate for the phase shift of the detected modulated signal relative to the excitation signal wherein a phase $\Delta\varphi$ of the reference signal is set relative to the excitation signal in order to nullify quadrature component Q of the demodulated signal. Accordingly, demodulator 206 may output in-phase component I as an unmodulated output signal representative of the capacitance of component 202.

Controller 212 may be configured to apply the excitation signal to one of the terminals of capacitance $C_M$ of component 202 as described above. In some embodiments, such excitation signal may comprise a square-wave signal. Controller 212 may also be configured to generate a digital equivalent of the excitation signal (e.g., a sine wave at carrier frequency $f_C$) to demodulator 206 such that demodulator 206 demodulates the modulated digital signal generated by ADC 208 and compensates for the phase shift of the detected modulated signal relative to the excitation signal as described above. For example, in some embodiments, the phase shift of the detected modulated signal relative to the excitation signal may be unknown, and thus, controller 212 may nullify quadrature component Q by varying phase shift $\Delta\varphi$ of the reference signal relative to the excitation signal until quadrature component Q is zero or approximately zero.

In some embodiments, controller 212 may set phase shift $\Delta\varphi$ of the reference signal relative to the excitation signal once during production or manufacturing of capacitance sensing circuit 200. In other embodiments, controller 212 may set phase shift $\Delta\varphi$ of the reference signal relative to the excitation signal once for each power cycle of capacitance sensing circuit 200. In yet other embodiments, controller 212 may set phase shift $\Delta\varphi$ of the reference signal relative to the excitation signal by continuously, during operation of capacitance sensing circuit 200, varying phase $\Delta\varphi$ of the reference signal relative to the excitation signal responsive in order to nullify the quadrature component.

Figure 3:
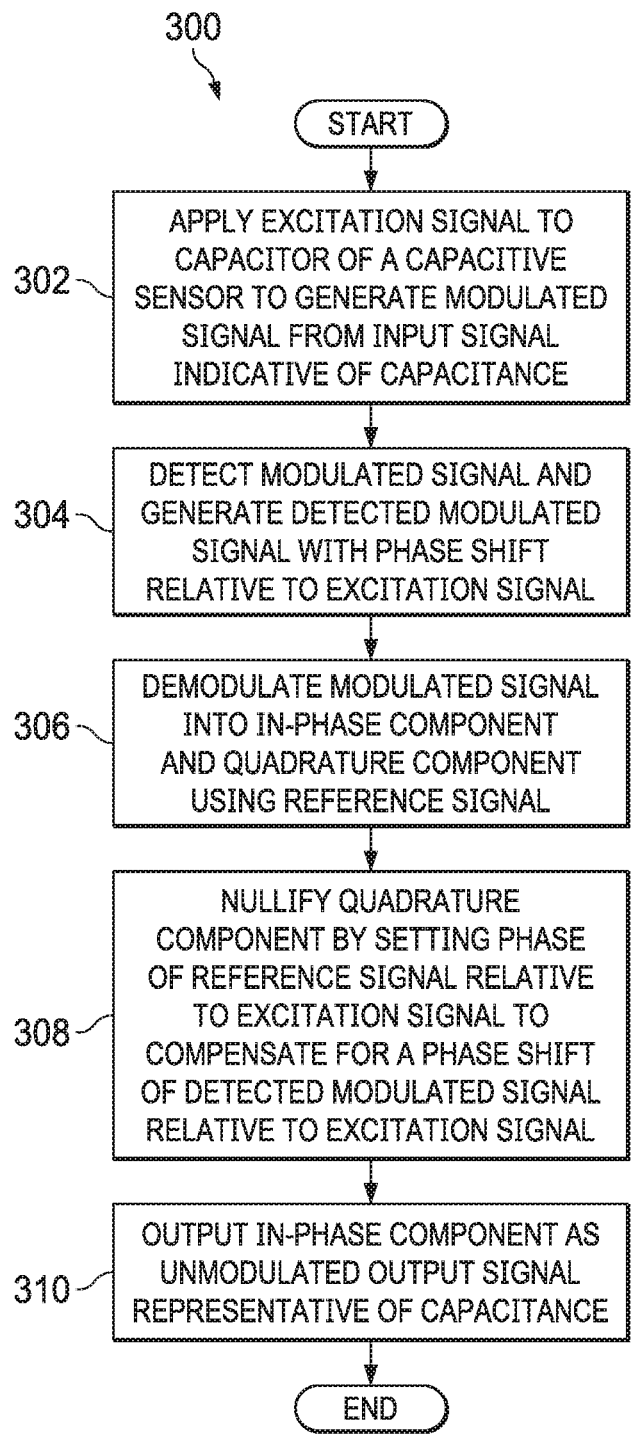
FIG. 3 is a flow chart of an example method for compensating for phase shift in a modulated signal, in accordance with embodiments of the present disclosure.

FIG. 3 is a flow chart of an example method 300 for compensating for phase shift in a modulated signal, in accordance with embodiments of the present disclosure. According to certain embodiments, method 300 may begin at step 302. As noted above, teachings of the present disclosure may be implemented in a variety of configurations of a capacitive sensing circuit. As such, the preferred initialization point for method 300 and the order of the steps comprising method 300 may depend on the implementation chosen. In these and other embodiments, method 300 may be implemented as firmware, software, applications, functions, libraries, or other instructions.

At step 302, signal generator (e.g., controller 112, controller 212) may apply an excitation signal to a capacitor of a capacitive sensor (e.g., component 102, component 202) which causes generation of a modulated signal from an input signal indicative of a variance in a capacitance (e.g., $C_M$) of the capacitor. At step 304, a detector (e.g., CVC 104, CVC 204) may detect the modulated signal and generate a detected modulated signal (e.g., voltage signal $V_{SENSE}$, output of ADC 208) that has a phase shift relative to the excitation signal. At step 306, a demodulator (e.g., demodulator 106, demodulator 206) may demodulate the modulated signal into an in-phase component (e.g., I) and a quadrature component (e.g., Q). In some embodiments, the modulated signal may comprise a digital signal and demodulating the modulated signal may comprise demodulating the modulated signal in a digital domain. In other embodiments, the modulated signal may comprise an analog signal and demodulating the modulated signal may comprise demodulating the modulated signal in an analog domain.

At step 308, a controller (e.g., controller 112, controller 212) may nullify the quadrature component (e.g., Q) by setting a phase (e.g., $\Delta\varphi$) of the reference signal relative to the excitation signal to compensate for a phase shift of the detected modulated signal relative to the excitation signal. As a result, at step 310, the modulator may output the in-phase component (e.g., I) as an unmodulated output signal representative of the capacitance (e.g., $C_M$).

Although FIG. 3 discloses a particular number of steps to be taken with respect to method 300, method 300 may be executed with greater or fewer steps than those depicted in FIG. 3. In addition, although FIG. 3 discloses a certain order of steps to be taken with respect to method 300, the steps comprising method 300 may be completed in any suitable order.

Method 300 may be implemented in whole or part using controller 112, controller 212, components thereof or any other system operable to implement method 300. In certain embodiments, method 300 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding this disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A method of measuring a capacitive sensor output of a capacitive sensor having a capacitor, the method comprising:
   detecting, by a detector, a modulated signal indicative of a capacitance of the capacitor with the detector to generate a detected modulated signal that has a phase shift relative to an excitation signal applied to the capacitor in order to generate the modulated signal;
   demodulating, by a demodulator, the detected modulated signal into an in-phase component and a quadrature component using a reference signal;
   nullifying, by a controller, the quadrature component by setting a phase of the reference signal relative to the excitation signal to compensate for the phase shift; and
   outputting, by an output, the in-phase component as an unmodulated output signal representative of a capacitance of the capacitor.

2. The method of claim 1, wherein the detected modulated signal is a digital signal and wherein demodulating the detected modulated signal comprises demodulating the detected modulated signal in a digital domain.

3. The method of claim 1, wherein the detected modulated signal is an analog signal and wherein demodulating the detected modulated signal comprises demodulating the detected modulated signal in an analog domain.

4. The method of claim 1, wherein the phase shift is unknown, and setting the phase of the reference signal comprises setting the phase of the reference signal relative to the excitation signal during production or manufacturing of an apparatus for conducting the method in order to nullify the quadrature component.

5. The method of claim 1, wherein the phase shift is unknown, and setting the phase of the reference signal comprises setting the phase of the reference signal relative to the excitation signal once per power cycle of an apparatus for conducting the method in order to nullify the quadrature component.

6. The method of claim 1, wherein the phase shift is unknown, and setting the phase of the reference signal comprises continuously varying the phase of the reference signal relative to the excitation signal responsive to variance of the phase shift in order to nullify the quadrature component.

7. The method of claim 1, wherein the variance in the capacitance of the capacitor is representative of a displacement of a transducer.

8. The method of claim 7, wherein the transducer comprises one of a speaker, a linear resonant actuator, and a haptic transducer.

9. An apparatus for measuring a capacitive sensor output of a capacitive sensor having a capacitor, comprising:
   a detector configured to detect a modulated signal indicative of a capacitance of the capacitor and generate a detected modulated signal that has a phase shift relative to an excitation signal applied to the capacitor in order to generate the modulated signal;
   a demodulator configured to demodulate the detected modulated signal into an in-phase component and a quadrature component using a reference signal;
   a controller configured to nullify the quadrature component by setting a phase of the reference signal relative to the excitation signal to compensate for the phase shift; and
   an output configured to output the in-phase component as an unmodulated output signal representative of the capacitance of the capacitor.

10. The apparatus of claim 9, wherein the detected modulated signal is a digital signal and wherein the demodulator is further configured to demodulate the detected modulated signal in a digital domain.

11. The apparatus of claim 9, wherein the detected modulated signal is an analog signal and wherein the demodulator is further configured to demodulate the detected modulated signal in an analog domain.

12. The apparatus of claim 9, wherein the phase shift is unknown, and the controller is further configured to set the phase of the reference signal relative to the excitation signal during production or manufacturing of the apparatus in order to nullify the quadrature component.

13. The apparatus of claim 9, wherein the phase shift is unknown, and the controller is further configured to set the phase of the reference signal relative to the excitation signal once per power cycle of the apparatus in order to nullify the quadrature component.

14. The apparatus of claim 9, wherein the phase shift is unknown, and the controller is further configured to set the phase of the reference signal by continuously varying the phase of the reference signal relative to the excitation signal responsive to variance of the phase shift in order to nullify the quadrature component.

15. The apparatus of claim 9, wherein the variance in the capacitance of the capacitor is representative of a displacement of a transducer.

16. The apparatus of claim 15, wherein the transducer comprises one of a speaker, a linear resonant actuator, and a haptic transducer.

* * * * *

UNITED STATES PATENT AND TRADEMARK OFFICE
CERTIFICATE OF CORRECTION

PATENT NO. : 11,119,138 B1
APPLICATION NO. : 16/838405
DATED : September 14, 2021
INVENTOR(S) : Arumugam et al.

It is certified that error appears in the above-identified patent and that said Letters Patent is hereby corrected as shown below:

In the Claims

In Column 6, Lines 60-61, in Claim 1, delete "a capacitance" and insert -- the capacitance --, therefor.

Signed and Sealed this
Fifteenth Day of August, 2023

Katherine Kelly Vidal
*Director of the United States Patent and Trademark Office*